(12) United States Patent
Shin et al.

(10) Patent No.: US 10,344,941 B2
(45) Date of Patent: Jul. 9, 2019

(54) VEHICLE LAMP

(71) Applicant: LG INNOTEK CO., LTD., Seoul (KR)

(72) Inventors: Jong Bae Shin, Seoul (KR); In Tae Kim, Seoul (KR); Boone Won, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 15/751,309

(22) PCT Filed: Aug. 12, 2016

(86) PCT No.: PCT/KR2016/008920
§ 371 (c)(1),
(2) Date: Feb. 8, 2018

(87) PCT Pub. No.: WO2017/026856
PCT Pub. Date: Feb. 16, 2017

(65) Prior Publication Data
US 2018/0231207 A1    Aug. 16, 2018

(30) Foreign Application Priority Data

Aug. 13, 2015  (KR) ........................ 10-2015-0114700

(51) Int. Cl.
| | | |
|---|---|---|
| B60Q 1/00 | (2006.01) |
| F21S 45/33 | (2018.01) |
| F21S 43/00 | (2018.01) |
| H01L 35/30 | (2006.01) |
| F21S 45/43 | (2018.01) |
| F21S 45/60 | (2018.01) |
| F21S 41/30 | (2018.01) |
| F21S 41/20 | (2018.01) |

(52) U.S. Cl.
CPC ............... *F21S 45/33* (2018.01); *F21S 41/28* (2018.01); *F21S 41/30* (2018.01); *F21S 43/00* (2018.01); *F21S 45/43* (2018.01); *F21S 45/60* (2018.01); *H01L 35/30* (2013.01)

(58) Field of Classification Search
CPC ............... F21S 41/28; F21S 41/30–395; F21S 43/00–20; F21S 43/26–27; F21S 45/30–49; F21S 45/60; H01L 35/30
USPC ........................................................ 362/547
See application file for complete search history.

(56) References Cited

FOREIGN PATENT DOCUMENTS

| KR | 10-2010-0048617 | 5/2010 |
| KR | 10-2010-0063999 | 6/2010 |

(Continued)

OTHER PUBLICATIONS

International Search Report (with English Translation) and Written Opinion dated Nov. 8, 2016 issued in Application No. PCT/KR2016/008920.

*Primary Examiner* — Jason M Han
(74) *Attorney, Agent, or Firm* — KED & Associates LLP

(57) ABSTRACT

An embodiment of the present invention relates to a vehicle lamp structure capable of removing condensation from a lens part, in which a heat source is supplied to a heat absorbing part of a thermoelectric module to increase a temperature of a cooling region, together with a temperature of a heat generation part (a heat generation region) of the thermoelectric module, thereby improving limited heat conversion efficiency of the thermoelectric module, and furthermore, a hot current of air and a high-temperature heat source are supplied to a lens part of a head lamp, thereby maximizing dehumidification efficiency in the lamp.

20 Claims, 11 Drawing Sheets

(56) References Cited

FOREIGN PATENT DOCUMENTS

| KR | 10-2010-0122642 | 11/2010 |
|----|-----------------|---------|
| KR | 10-2015-0082914 | 7/2015  |
| WO | WO 2015/084015  | 6/2015  |

VEHICLE LAMP

This application is a U.S. National Stage Application under 35 U.S.C. § 371 of PCT Application No. PCT/KR2016/008920, filed Aug. 12, 2016, which claims priority to Korean Patent Application No. 10-2015-0114700, filed Aug. 13, 2015, whose entire disclosures are hereby incorporated by reference.

TECHNICAL FIELD

Embodiments of the present invention relate to a vehicle lamp structure capable of removing condensation from a lens part.

BACKGROUND ART

A head lamp of a vehicle is used to project light ahead of the vehicle during driving. A light source is installed inside the head lamp, and light from the light source is projected upward or downward ahead of the vehicle.

The head lamp is in a high-temperature environment caused by heat of the light source of the head lamp, heat transferred from an engine of the vehicle, etc. Thus, a temperature difference occurs between the head lamp and the outside and thus condensation may form inside the head lamp.

When the inside of the head lamp gets damp, the light source of the head lamp may malfunction and the marketability of the head lamp may decrease, and thus condensation has been recognized as a chronic problem in a vehicle head lamp system. Accordingly, various solutions thereto have been introduced but a fundamental solution has yet to be provided.

DISCLOSURE

Technical Problem

Embodiments of the present invention are directed to solving the above-described problem, and particularly, providing a structure of a vehicle lamp which is capable of improving limited heat conversion efficiency of a thermoelectric module by supplying a heat source to a heat absorbing part of the thermoelectric module so as to increase a temperature of a cooling region, together with a temperature of a heat generation part (a heat generation region) of the thermoelectric module, which is capable of maximizing dehumidification efficiency in the lamp by supplying a hot current of air and a high-temperature heat source to a lens part of a head lamp, and which is capable of efficiently removing snow piling on or ice formed on an outer surface of a lens in winter.

Technical Solution

One aspect of the present invention provides a vehicle lamp including a lens part; a light source module arranged to form a separation space together with the lens part, and including a reflective part accommodating a light-emitting device; a bezel part located adjacent to the light source module, and providing the separation space between the lens part and the light source module; and a thermoelectric circulation part configured to provide air passing through a thermoelectric module into the separation space. In particular, the thermoelectric module includes a heating part located adjacent to a substrate forming a cooling region and configured to supply a heat source to the substrate.

Advantageous Effects

According to an embodiment of the present invention, a heat source may be supplied to a heat absorbing part of a thermoelectric module so as to increase a temperature of a cooling region, together with a temperature of a heat generation part (a heat generation region) of the thermoelectric module, thereby improving limited heat conversion efficiency of the thermoelectric module, and furthermore, a hot current of air and a high-temperature heat source may be supplied to a lens part of a head lamp, thereby maximizing dehumidification efficiency in the lamp. In addition, snow piling on or ice formed on an outer surface of a lens in winter may be efficiently removed.

According to another embodiment of the present invention, a thermoelectric circulation part is configured such that a heat absorbing part of a thermoelectric module comes in contact with a heat generation source of a light source of a vehicle lamp. Thus, a temperature of the heat absorbing part of the thermoelectric module can be increased while facilitating dissipation of heat from the light source of the lamp, so that a temperature of a heat generation part may be also increased, thereby efficiently increasing a temperature of a hot current of air to perform dehumidification. Accordingly, the heat absorbing part of the thermoelectric module may perform a lamp heat dissipation function and increase the temperature of the heat generation part opposite to the heat absorbing part to control formation of a hot current of air, thereby maximizing dehumidification effect.

Furthermore, dehumidification of a lens of the lamp may be efficiently performed through a function of the thermoelectric circulation part.

According to another embodiment of the present invention, an air channel part is provided on a bezel part essentially included in the vicinity of a light source of a vehicle lamp to simplify an air-blowing system, and air may be selectively supplied to not only all surfaces of a lens but also local regions of the surfaces of the lens. Thus, capacities of a thermoelectric module and a ventilation module may be significantly decreased.

That is, a thermoelectric circulation part according to an embodiment of the present invention may fundamentally prevent formation of condensation by increasing a surface temperature of a lens of a head lamp by air heated by the thermoelectric module. Particularly, in this case, a warm or hot current of air may be selectively provided to some regions of the lens on which condensation forms.

MODES OF THE INVENTION

Figure 1:
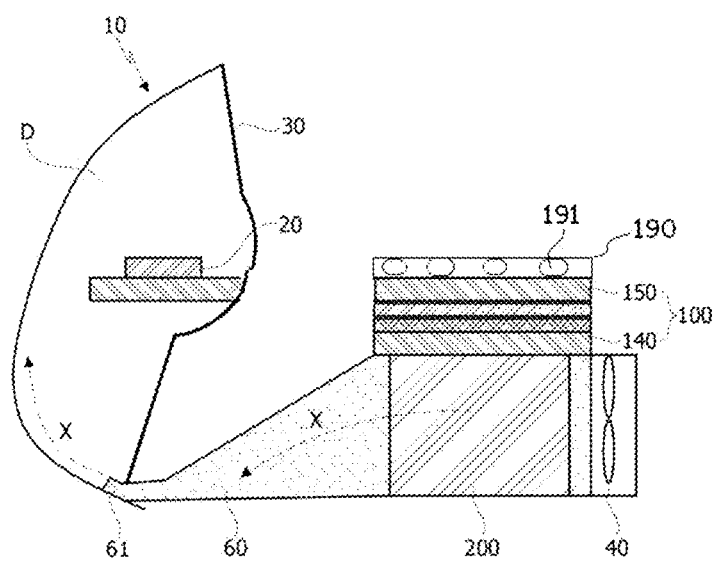
FIGS. 1 and 2 are conceptual diagrams of cross sections of vehicle lamps according to embodiments of the present invention.

Hereinafter, structures and effects according to the present invention will be described in detail with reference to the accompanying drawings. In this case, the same components are assigned the same reference numerals throughout the drawings and are not redundantly described to avoid redundancy. It will be understood that, although the terms first, second, etc. may be used herein to describe various elements, these elements should not be limited by these terms. These terms are only used to distinguish one element from another.

FIG. 1 is a conceptual diagram of a cross section of a vehicle lamp according to an embodiment of the present invention.

Referring to FIG. 1, a vehicle lamp according to an embodiment of the present invention may include a lens part 10, a light source module 20 arranged to form a separation space D together with the lens part 10 and including a reflective part 21 accommodating a light-emitting device, a bezel part 30 located adjacent to the light source module 20 and providing the separation space D between the lens part 10 and the light source module 20, and a thermoelectric circulation part 40 configured to transfer air passing through a thermoelectric module 100 into the separation space D. Particularly, in this case, the vehicle lamp may further include a heating part 190 configured to supply a heat source to a location adjacent to a heat absorbing part forming a cooling region of the thermoelectric module 100.

The heating part 190 may be arranged, particularly, on a substrate forming a cooling region of the thermoelectric module 100 in which a thermoelectric semiconductor device is located between a first substrate 140 and a second substrate 150 which are a pair of opposite substrates. In the present embodiment, structures and effects will be described below with respect to a case in which a substrate forming a cooling region is implemented in the second substrate 150.

In detail, the lens part 10 may be an outermost lens of a head lamp of a vehicle, and is coupled to a housing of the lamp to form an external appearance of the lamp. One or more light source modules 20 configured to emit light to the outside via the lens part 10 may be provided. In an embodiment of the present invention, a structure emitting a low beam and a high beam will be described as an example below. The light source module 20 should be understood as a concept covering structures including a light-emitting package having various types of solid light-emitting devices, such as a halogen lamp, an HID lamp, a light-emitting diode (LED), a laser diode (LD), or an organic LED (OLED), and the reflective part 21 formed adjacent to the light-emitting device.

An intermediate cover member, a so-called 'bezel part' 30, is provided in the vicinity of a light emission surface of the light source module 20 to improve the appearance of the inside of the lamp and perform a reflecting function. In the present embodiment, air heated by a heat generation part of the thermoelectric module 100 is supplied to a separation space D between a rear surface of the lens part 10 and the bezel part 30 to remove condensation from a surface of lens part 10. Furthermore, in order to maximize thermoelectric efficiency of the thermoelectric module 100, the heating part 190 is arranged on the second substrate 150 forming a light absorbing region of the thermoelectric module 100 to increase a temperature of a heat absorbing part of the second substrate 150. Thus, a temperature of the heat generation part having a predetermined heat conversion capacity may be also relatively increased, thereby increasing an overall temperature of a warm current of air. Accordingly, a temperature of a cooling part of the thermoelectric module 100 is increased by a certain degree and thus the temperature of the heat generation part may be more increased according to a predetermined thermoelectric capacity ΔT of the thermoelectric module 100, thereby more efficiently increasing the temperature of the warm current of air.

For example, generally, a temperature convertible into a warm current of air is 80° C. when a predetermined temperature variation ΔT of a heat generation part and a cooling part of a thermoelectric module applied to an embodiment of the present invention is 40° C., a predetermined temperature of the cooling part is 40° C., and a predetermined temperature of the heat generation part is 80° C. However, when a second heat conversion member comes into contact with a light source part and thus a temperature thereof increases to 50° C., a maximum temperature of the heat generation part may increase to 90° C. due to the predetermined temperature variation ΔT of 40° C. In this case, the temperature of the warm current of air may be increased to 90° C. Accordingly, higher-temperature wind may be obtained with the same power.

In the structure illustrated in FIG. 1, a first heat conversion part 200 including a first heat conversion member (see reference numeral '52' of FIG. 5 or reference numeral '220' of FIG. 10) may be arranged on a part of the first substrate 140 forming the heat generation part of the thermoelectric module 100. The thermoelectric circulation part 40 configured to induce air from the outside or internal air of the lamp to be transferred into the first heat transfer member may be arranged behind the first heat conversion part 200. The thermoelectric circulation part 40 may include a first ventilation module 42 having a fan. In addition, although not shown, the thermoelectric circulation part 40 may include various types of components such as a power source part for supplying power to the first ventilation module 42 or a circuit substrate including a wiring part and a controller.

For example, in the structure of the vehicle lamp according to the present invention, as air is moved by the thermoelectric circulation part 40 and passes through the first heat conversion member included in the first heat conversion part 200 of the thermoelectric module 100, a temperature of the air increases due to a heat generation effect. The heated air moves along a ventilation guide part 60 arranged adjacent to or coupled to the first heat conversion part 200, and a warm current of air X is supplied to the separation space D from a discharge part 61 which is an end part of the ventilation guide part 60. Thus, condensation may be removed from a surface of the lens part 10. A temperature of the warm current of air X may be more increased due to an operation of the heating part 190 according to an embodiment of the present invention as described above.

Various types of devices or structures capable of heating the second substrate 150 of the thermoelectric module 100 by supplying a heat source to the second substrate 150 are applicable as the heating part 190. For example, as illustrated in FIG. 1, a hot wire 191 may be arranged to be in contact with or adjacent to the second substrate 150 to apply heat to the second substrate 150 directly or via a heat transfer structure.

Figure 2:
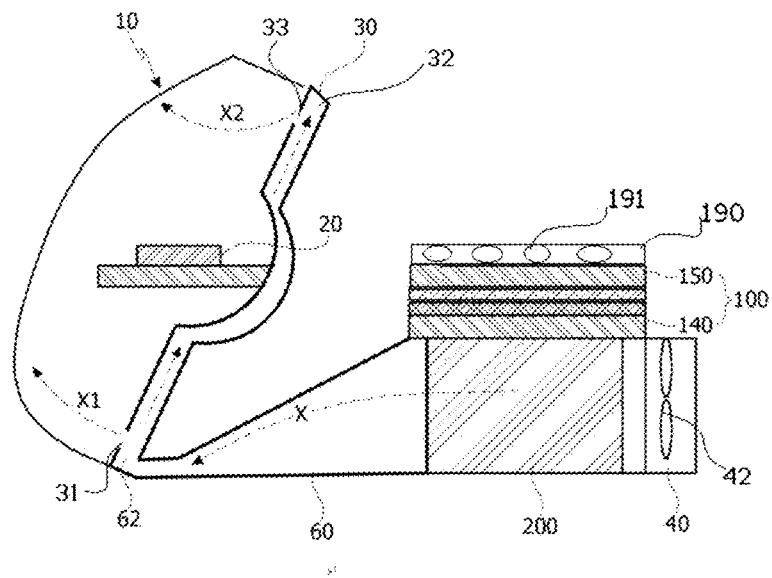

FIG. 2 illustrates a vehicle lamp according to another embodiment of the present invention, which is different from the vehicle lamp of FIG. 1 according to the embodiment. The embodiment of FIG. 2 is the same as that of FIG. 1, in that a heating part 190 is arranged adjacent to a thermoelectric module 100. However, FIG. 2 illustrates the vehicle lamp according to an embodiment different from the vehicle lamp of FIG. 1 according to the embodiment. The embodiment of FIG. 2 is the same as that of FIG. 1 in terms of a structure of contact between the thermoelectric module 100 and a light source module 20, a structure of a first heat conversion part 200, etc. The embodiment of FIG. 2 is different from that of FIG. 1, in that a structure of a part which guides air, which is converted into a warm current of air via the first heat conversion part 200, to a separation space D is modified. That is, an air channel part 32 via which air moves is formed on a surface of or inside a bezel part 30, and air supplied through a thermoelectric circulation part 40 which will be described below is guided to emit a warm current of air from the surface of the bezel part 30 to the separation space D between a lens part 10 and the bezel part 30.

That is, the vehicle lamp according to the embodiment of the present invention includes the thermoelectric circulation part 40 configured to supply a warm current of air to remove condensation from a surface region of the lens part 10. A warm current of air is obtained using the thermoelectric module 100, and movement of the warm current of air is guided through the air channel part 32 provided inside of or an outer surface of the bezel part 30. Thus, the warm current of air may be directly provided to all surfaces of the lens part 10, and local regions, e.g., edge regions, of the lens part 10 on which condensation is very likely to form, thereby preventing formation of condensation.

The warm current of air guided along the air channel part 32 is discharged via air discharge parts 31 and 33 arranged on a surface of the bezel part 30. In this case, the air discharge parts 31 and 33 are arranged in at least two regions among surface regions of the bezel part 30 to intensively supply the warm current of air to the local regions in which condensation is likely to form. Accordingly, condensation may be removed even with a small amount of power, thereby increasing the efficiency of removing condensation.

The air discharge parts 31 and 33 may be provided on the same horizontal line as the edge regions of the lens part 10 which are vulnerable regions in which condensation frequently forms. That is, the air discharge parts 31 and 33 may be provided, in the form of one or more holes or slits formed, at left and right edge portions of the lens part 10 or other edge locations on the lens part 10. The air discharge parts 31 and 33 may have variously shapes, e.g., wedge-shaped holes or slits having a certain length, which may spread out on a surface of the lens, to control a direction of wind.

Thus, one end of the air channel part 32 may communicate with the thermoelectric circulation part 40, and another end thereof may communicate with the separation space D. Furthermore, the air channel part 32 is provided on an outer surface of the bezel part 30 in the structure of FIG. 2 but may be provided, as another example, in the form of a channel in the bezel part 30. When a channel is formed in the bezel part 30 as described above, an external structure of the bezel part 30 may become simple and thinner and thus a wider arrangement space for the thermoelectric module 100 and the thermoelectric circulation part 40 installed in a limited space may be secured.

Furthermore, a second ventilation module, such as a fan having an auxiliary function, which is controllable to facilitate the flow of air, may be arranged in the air channel part 32. As described above, in the structure of FIG. 2, a desired amount or pressure of wind may be difficult to achieve with an arrangement of the thermoelectric circulation part 40 including one first ventilation module 42, since a degree of freedom of a vehicle is low in that an arrangement space for a lamp is limited to a front part of the vehicle. Accordingly, an auxiliary fan may be provided to achieve a stronger wind pressure.

The present invention is not limited to a structure including a single ventilation module and a thermoelectric module as in the structure of FIG. 2, and according to another embodiment, the structure may be modified such that a plurality of heat conversion members (e.g., heat sink members) each including a plurality of thermoelectric modules are arranged to achieve a warm current of air and a plurality of fans are provided, or such that one thermoelectric module is shared by a plurality of fans.

Figure 3:
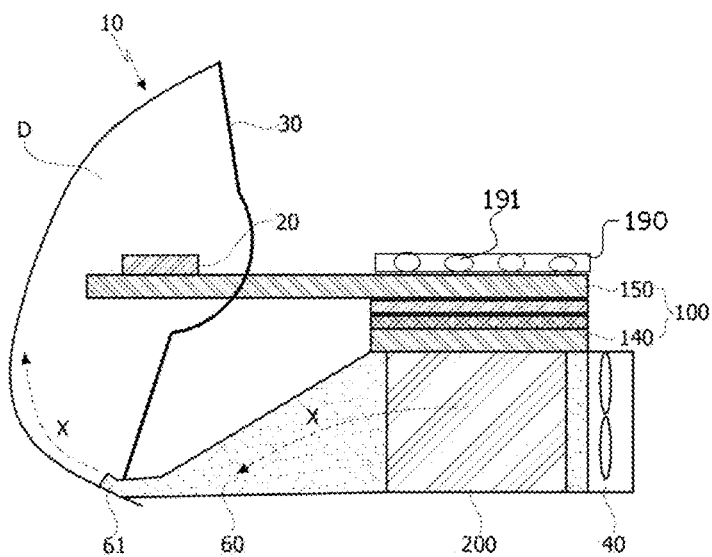
FIGS. 3 and 4 are conceptual diagrams of cross sections of vehicle lamps according to other embodiments of the present invention.

FIG. 3 is a conceptual diagram of a cross section of a vehicle lamp according to another embodiment of the present invention. In particular, FIG. 3 is a modified example of the embodiment of FIG. 1. The embodiment of FIG. 3 is the same as the embodiment of FIG. 1 in that a heating part 190 is arranged adjacent to a second substrate 150 but is different from the embodiment of FIG. 1 in that the second substrate 150 or a heat conversion member such as a heat sink on the second substrate 150 is formed to be in contact with a region of the light source module 20. That is, a heat source may be applied not only via the heating part 190 but also using heat generated by the light source module 20. Thus, dissipation of heat from a lamp light source may be facilitated, and a temperature of a heat generation part may be increased by increasing a temperature of a heat absorbing part of a thermoelectric module 100, thereby efficiently increasing a temperature of a hot current of air to perform dehumidification.

In a structure of FIG. 3, a principle of increasing a temperature of a warm current of air by supplying a heat source to a cooling region of the thermoelectric module 100 is the same as that described above with reference to FIG. 1. In particular, in the structure of the present embodiment, both a heat dissipation function of the light source module 20 and the thermoelectric efficiency of the thermoelectric module 100 may be improved. In detail, when either a second substrate 150 forming the heat absorbing part or a second heat conversion part (see reference numeral '300' of FIG. 10) on the second substrate 150 comes into contact with a portion of the light source module 20 generating heat, heat generated from a light source may be dissipated and a temperature of a cooling part of the thermoelectric module 100 may be increased by a certain degree to more increase a temperature of the heat generation part according to a predetermined thermoelectric capacity ΔT of the thermoelectric module 100, thereby more efficiently increasing a temperature of a warm current of air. As described above, due to the efficiency of providing the warm current of air, when the second substrate 150 forming the heat absorbing part of the thermoelectric module 100 or a second conversion part (not shown) on the second substrate 150 comes into contact with the light source module 20, heat generated by the light source module 20 may be efficiently dissipated and a temperature of the cooling part of thermoelectric module 100 may be increased by a certain degree to increase a temperature of the heat generation part. Accordingly, the effect of heating air can be increased with the same amount of power.

Figure 4:
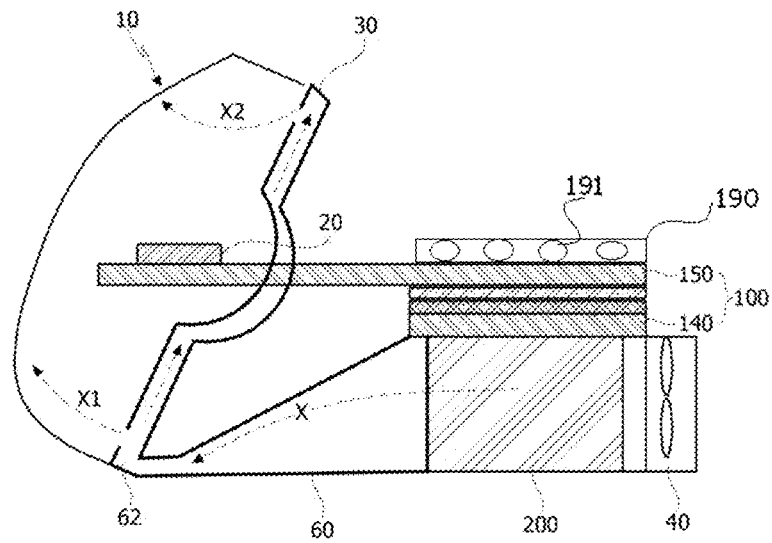

FIG. 4 is a conceptual diagram illustrating a structure of a vehicle lamp according to another embodiment of the present invention. The embodiment of FIG. 4 is a modified example of the embodiment of FIG. 2, and is the same as the embodiment of FIG. 2 in that a heating part 190 is arranged adjacent to a second substrate 150 but is different from the embodiment of FIG. 2 in that the second substrate 150 or a heat conversion member such as a heat sink on the second substrate 150 is formed to be in contact with a region of a light source module 20. A principle of increasing thermoelectric efficiency through contact of either a substrate of a thermoelectric module 100 or the heat conversion member with the light source module 20 is as described above with respect to the structure of FIG. 3 and is not described again here.

Figure 5:
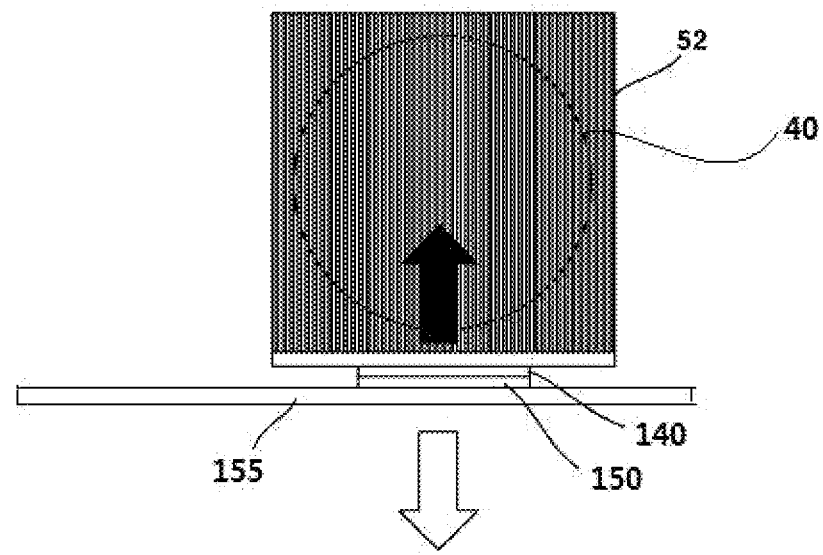
FIG. 5 is a schematic front view of a structure of a thermoelectric circulation part as illustrated in FIGS. 1 to 4.

FIG. 5 is a schematic front view of a structure of a thermoelectric circulation part as illustrated in FIGS. 1 to 4.

A thermoelectric module applied to an embodiment of the present invention has a structure in which a plurality of thermoelectric semiconductor devices are provided between a first substrate 140 and a second substrate 150 facing each other. In this case, a region of the first substrate 140 serves as a heat generating region due to the thermoelectric effect, and a structure such as a first heat conversion member 52 may be arranged on the first substrate 140 as illustrated in FIG. 3. A thermoelectric circulation part 40 including a first ventilation module is arranged at a rear part of the first heat conversion member 52, so that air passing through the first heat conversion member 52 may be converted into a warm current of air.

That is, the structures of FIGS. 1 and 2 employ only a heating part, and the structures of FIGS. 3 and 4 have a structure in which the second substrate 150 of FIG. 5 is in contact with the light source module 20 and the thermoelectric circulation part 40 is arranged at the rear part of the first heat conversion member 52. Thus, air passing through the first heat conversion member 52 forming a heat generation region (as indicated by a black arrow) is converted into a warm current of heated air.

Figure 6:
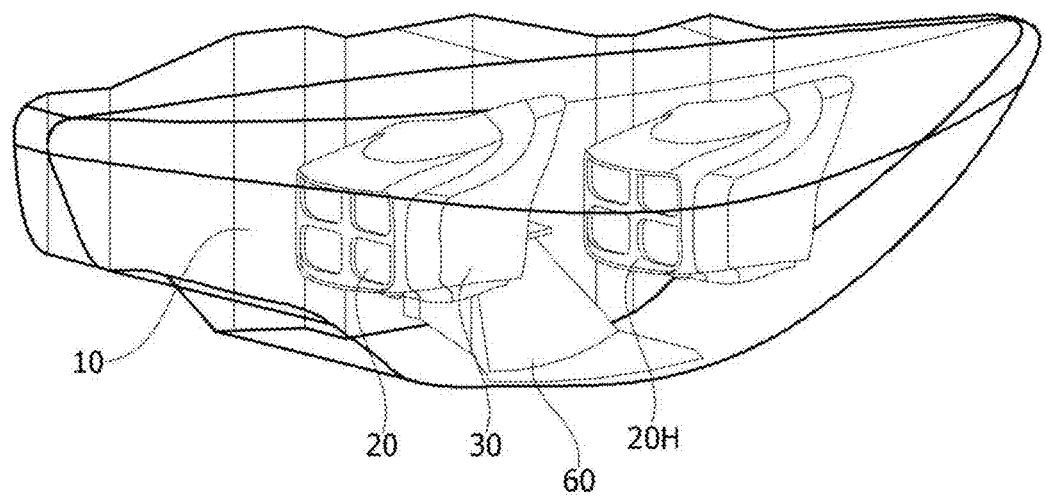
FIG. 6 is a perspective view of an image of a vehicle lamp according to an embodiment of the present invention.
Figure 7:
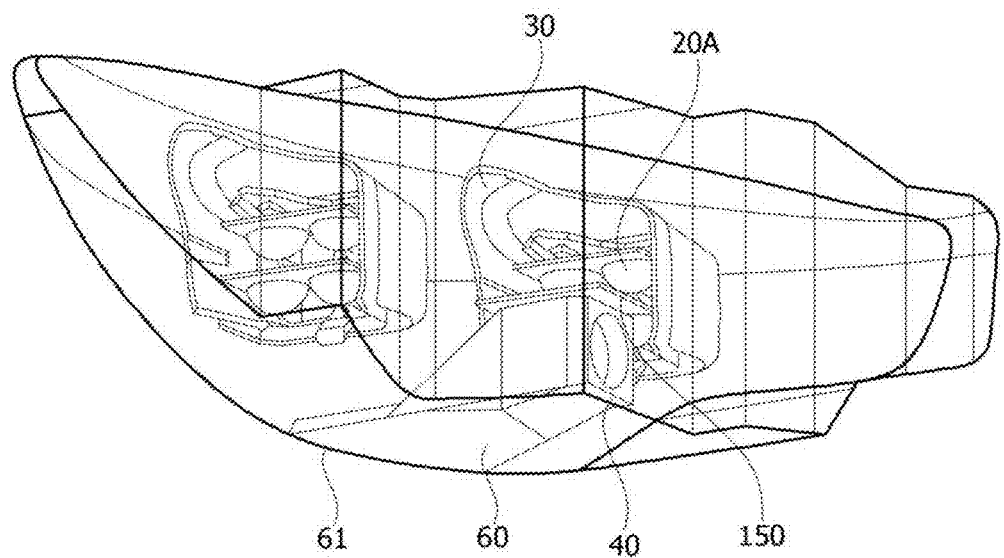
FIG. 7 is a perspective drawing of an image of a rear surface of the vehicle lamp of FIG. 6.

FIG. 6 is a perspective view of an image of a vehicle lamp according to an embodiment of the present invention. FIG. 7 is a perspective drawing of an image of a rear surface of the vehicle lamp of FIG. 6. Referring to FIGS. 6 and 7, as described above with reference to FIGS. 1 to 4, a heat source is applied to the second substrate 150 of the thermoelectric module 100, which performs a cooling action (a heat absorbing action), via the heating part 190 or the second substrate 150 is arranged to be in contact with an external case 20A of a light source module, and the first heat conversion part 200 accommodating the first heat conversion member and the thermoelectric circulation part 40 behind the first heat conversion part 200 are arranged on the first substrate 140 so as to achieve a warm current of air. The warm current of air may be discharged via the discharge part 61 which is an end part of the ventilation guide part 60 and may be thereafter supplied onto a surface of the lens part as illustrated in the conceptual diagram of FIG. 1.

Various embodiments of a thermoelectric module applicable to a vehicle lamp according to an embodiment of the present invention as described above will be described below.

Figure 8:
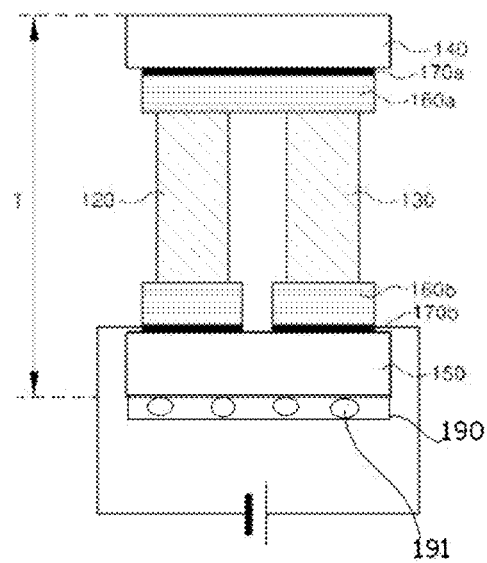
FIG. 8 is a cross-sectional view of essential parts of a thermoelectric module applicable to the vehicle lamps of FIGS. 1 to 4, according to an embodiment of the present invention.
Figure 9:
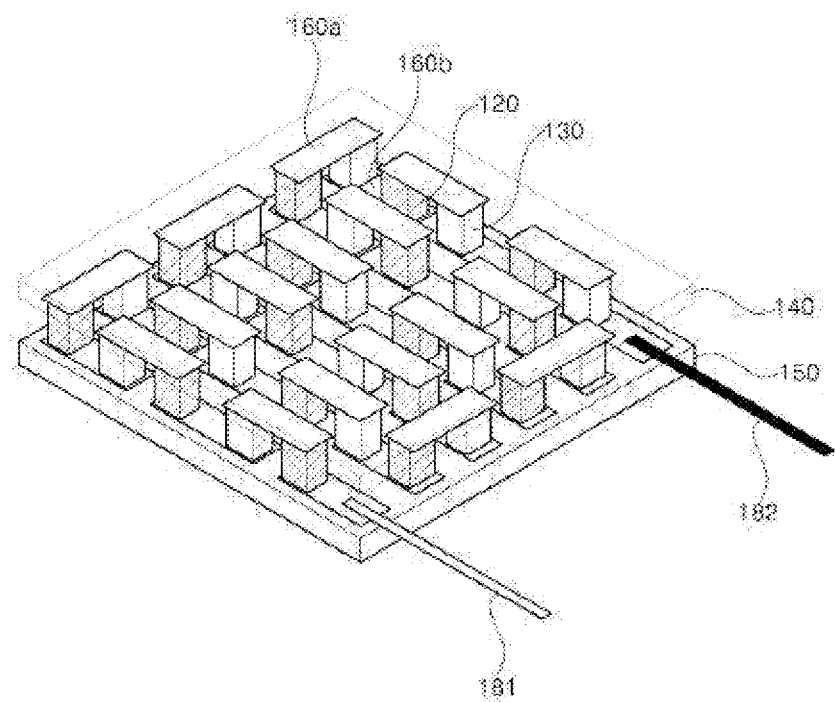
FIG. 9 is an enlarged view of a result of modularizing the structure of FIG. 8.

FIG. 8 is a cross-sectional view of essential parts of a thermoelectric module applicable to the vehicle lamps described above with reference to FIGS. 1 to 4, according to an embodiment of the present invention. FIG. 9 is an enlarged view of a result of modularizing the structure of FIG. 8.

A thermoelectric module 100 applicable to a vehicle lamp according to an embodiment of the present invention has a structure in which a first semiconductor device 120 and a second semiconductor device 130 are arranged between a first substrate 140 and a second substrate 150 facing the first substrate 140. In particular, a first heat conversion part 200 performing a heat generating function is arranged on the first substrate 140 to perform a heat generating action, and a second heat conversion part 300 performing a heat absorbing function is arranged on the second substrate 150 to perform a cooling function. As will be described below, the first heat conversion part 200 will be defined as a module including the first heat conversion member 52 of FIG. 5.

The first substrate 140 and the second substrate 150 may be insulating substrates, e.g., alumina substrates. According to another embodiment, metal substrates may be used to achieve heat absorbing efficiency and heat generating efficiency and achieve thin-film type substrates. When the first substrate 140 and the second substrate 150 are metal substrates, a dielectric layer 170a may be formed between the first substrate 140 and an electrode layer 160a on the first substrate 140, and a dielectric layer 170b may be formed between the second substrate 150 and an electrode layer 160b on the second substrate 150, as illustrated in FIG. 8.

When the first substrate 140 and the second substrate 150 are metal substrates, Cu or a Cu alloy may be used, and the metal substrates may be formed to a thickness of 0.1 mm to 0.5 mm to obtain thin-film type substrates. When the thicknesses of the metal substrates are less than 0.1 mm or greater than 0.5 mm, a heat dissipation degree or heat conductivity may be excessively high and thus the reliability of the thermoelectric module 100 may be significantly degraded. The dielectric layers 170a and 170b may be formed of a dielectric material having high heat dissipation performance and having thermal conductivity of 5 to 10 W/K when thermal conductivity of a cooling thermoelectric module is taken into account, and may be formed to a thickness of 0.01 mm to 0.15 mm. In this case, insulating efficiency (or withstand voltage characteristics) is very low when the thicknesses of the dielectric layers 170a and 170b are less than 0.01 mm, and thermal conductivity is low and thus heat dissipation efficiency is low when the thicknesses of the dielectric layers 170a and 170b are greater than 0.15 mm. The electrode layers 160a and 160b are formed of an electrode material such as Cu, Ag, or Ni, and electrically connect a first semiconductor device and a second semiconductor device. When a plurality of units cells as illustrated above are connected, adjacent unit cells are electrically connected as illustrated in FIG. 7. Thicknesses of these electrode layers may be in a range of 0.01 mm to 0.3 mm. When the thicknesses of these electrode layers are less than 0.01 mm, the functions thereof as electrodes decrease and thus electrical conductivity is low. When the thicknesses of these electrode layers are greater than 0.3 mm, resistance increases and conduction efficiency thus becomes low.

In particular, a heating part 190 for supplying a heat source may be arranged on the second substrate 150 forming a heat absorbing part, i.e., a cooling region, of a thermoelectric module according to an embodiment of the present invention as described above.

Figure 14:
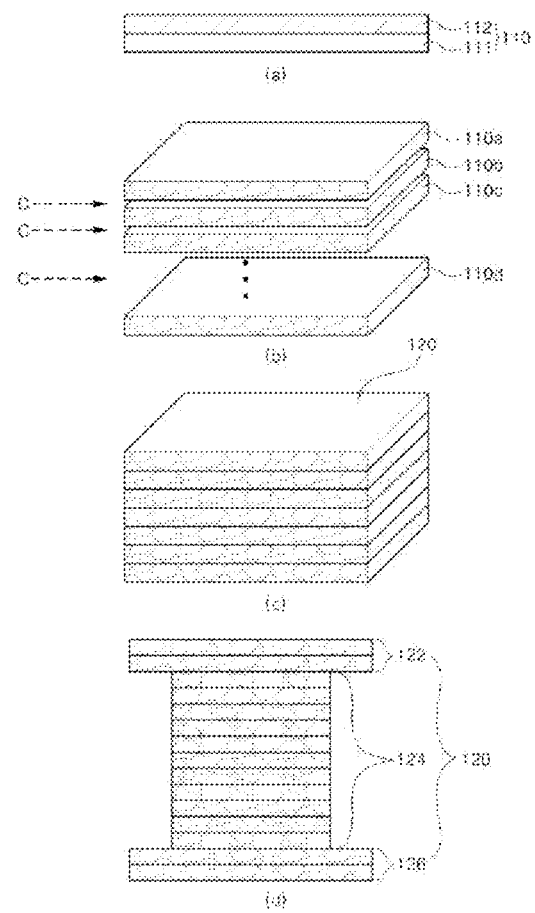
FIG. 14 illustrates an example of forming a thermoelectric semiconductor device in a different structure and by a different method from thermoelectric semiconductor devices of FIGS. 8 and 13 according to another embodiment of the present invention.

FIG. 9 illustrates a module in which a plurality of unit cells (pairs of thermoelectric semiconductor devices) such as the structure of FIG. 8 are connected. In particular, in this case, thermoelectric elements of each of the unit cells may be thermoelectric elements including stack type unit elements as illustrated in FIG. 14 as will be described below. In this case, one of the thermoelectric elements may include a first semiconductor device 120 which is a P type semiconductor and a second semiconductor device 130 which is an N type semiconductor. The first semiconductor device 120 and the second semiconductor device 130 are connected to metal electrodes 160a and 160b. The Peltier effect is achieved by forming a plurality of such structures, and circuit lines 181 and 182 for supplying a current to the semiconductor devices through electrodes.

A P type semiconductor material or an N type semiconductor material may be applied to semiconductor devices included in a thermoelectric module. The P or N type semiconductor material of the N type semiconductor device may be a mixture of a bismuth telluride (BiTe)-based main source material, such as selenium (Se), nickel (Ni), aluminum (Al), copper (Cu), silver (Ag), lead (Pb), boron (B), gallium (Ga), tellurium (Te), bismuth (Bi), and indium (In), and Bi or Te in an amount of 0.001 to 1.0 wt % with respect to the total weight of the main source material. For example, the main source material may be Bi—Se—Te, and the P or N type semiconductor material may be obtained by adding, to Bi—Se—Te, Bi or Te in an amount of 0.001 to 1.0 wt % with respect to the total weight of Bi—Se—Te. That is, when 100 g of Bi—Se—Te is injected, Bi or Te to be additionally mixed is preferably injected in a range of 0.001 g to 1.0 g. As described above, when a range of weight percentages of a material added to the main source material is not in the range of 0.001 wt % to 1.0 wt %, thermal conductivity does not decrease and electrical conductivity decreases. Thus, an increase in a ZT value cannot be expected.

The P type semiconductor material is preferably a mixture of a bismuth telluride (BiTe)-based main source material, such as antimony (Sb), nickel (Ni), aluminum (Al), copper (Cu), silver (Ag), lead (Pb), boron (B), gallium (Ga), tellurium (Te), bismuth (Bi), and indium (In), and Bi or Te in an amount of 0.001 to 1.0 wt % with respect to the total weight of the main source material. For example, the main source material may be Bi—Sb—Te, and the P type semiconductor material may be obtained by adding, to Bi—Sb—Te, Bi or Te in an amount of 0.001 to 1.0 wt % with respect to the total weight of Bi—Sb—Te. That is, when 100 g of Bi—Sb—Te is injected, Bi or Te to be additionally mixed may be injected in a range of 0.001 g to 1 g. When a range of weight percentages of a material added to the main source material described above is not in the range of 0.001 wt % to 1.0 wt %, thermal conductivity does not decrease and electrical conductivity decreases. Thus, an increase in a ZT value cannot be expected.

Although the first semiconductor device 120 and the second semiconductor device 130 which form a unit cell and face each other have the same shape and same size, the P type semiconductor device and the N type semiconductor device have different electrical conductivity characteristics and may thus decrease cooling efficiency. Thus, a volume of one of the first semiconductor device 120 and the second semiconductor device 130 facing each other may be set to be different from that of the other semiconductor device so as to improve cooling performance.

That is, semiconductor devices of a unit cell which face each other and have different volumes may be obtained by forming semiconductor devices in different shapes, forming semiconductor devices such that they have the same height but a diameter of a cross section of one of them is greater than that of a cross section of the other semiconductor device, or forming semiconductor devices such that they have the same shape but are different in terms of height or a diameter of a cross section thereof. In particular, thermoelectric efficiency may be improved by forming a diameter of an N type semiconductor device to be greater than that of a P type semiconductor device to increase the volume of the N type semiconductor device.

Figure 10:
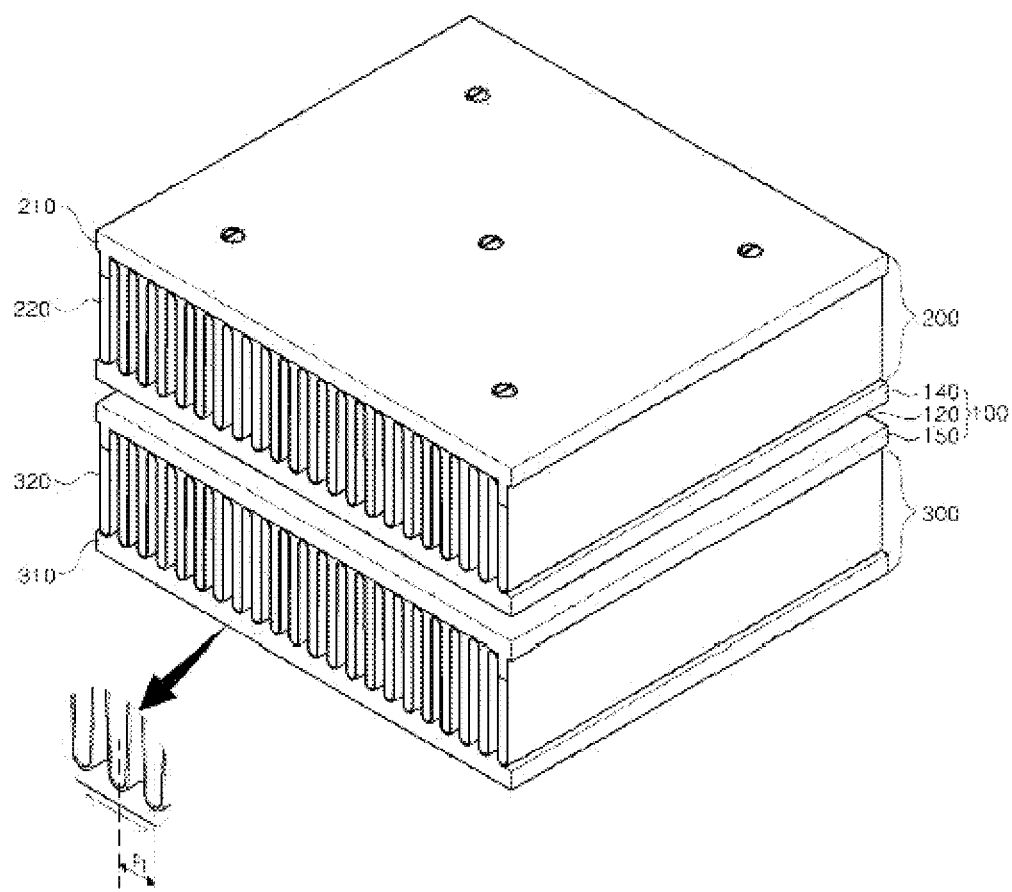
FIG. 10 illustrates a thermoelectric module and a heat conversion member which are another embodiment of those of FIGS. 1 to 5.

FIG. 10 illustrates a thermoelectric module and a heat conversion member which are another embodiment of those of FIGS. 1 to 5. A structure in which a plurality of cooling fin structures or a plurality of thin plate type structures are arranged is provided as an example of the first heat conversion member described above with reference to FIG. 5, whereas in the present embodiment of FIG. 10, a structure having a curvature is provided as an example of a heat conversion member to maximize heat generating efficiency or cooling efficiency.

Referring to FIG. 10, a first heat conversion part 200 is located on a thermoelectric module 100 including a thermoelectric semiconductor device between a pair of substrates 120 and 140, and a second heat conversion part 300 is located under the thermoelectric module 100. The first heat conversion part 200 and the second heat conversion part 300 are configured to perform heat conversion on incoming air or air to be discharged using the thermoelectric effect achieved by the first substrate 140 and the second substrate 150 of the thermoelectric module 100. When the thermoelectric module 100 of FIG. 10 is applied to the embodiments of the present invention of FIGS. 1 to 4, the second heat conversion part 300 may be omitted. To increase cooling efficiency, the second heat conversion part 300 may be modified to be in contact with the light source module 20 of the structure of FIG. 3 or 4 as described above.

In particular, in the first heat conversion part 200, a heat generation part is provided to convert air passing through the first ventilation module such as a fan in the structures of FIGS. 1 to 4 into a warm current of air when the air passes through the first heat conversion member 52 of FIG. 5 or a first heat conversion member 220 of FIG. 10. The first heat conversion part 200 includes the heat conversion member 220 located on the first substrate 140. This structure is the same as a structure in which the second heat conversion part 300 includes a heat conversion member 320 on the second substrate 150. Accordingly, a structure including the heat conversion member 220 of the first heat conversion part 200 will be described as an example below.

The first heat conversion part 200 may be arranged to be in contact with the first substrate 140 as illustrated in FIG. 10. Thus, air passing through the first heat conversion member 220 of the first heat conversion part 200 may be converted into a warm current of air having an increased temperature through a heat generation action, and supplied to a lens part via the air channel part described above with reference to FIG. 2 or 4.

As in the structure of FIG. 10, the first heat conversion member 220 included in the first heat conversion part 200 having a heat generating function and the second heat conversion member 320 included in the second heat conversion part 300 having a heat absorbing function may be configured to be in direct contact with the first substrate 140 and the second substrate 150 but may be arranged in separate accommodation modules 210 and 310.

Figure 11:
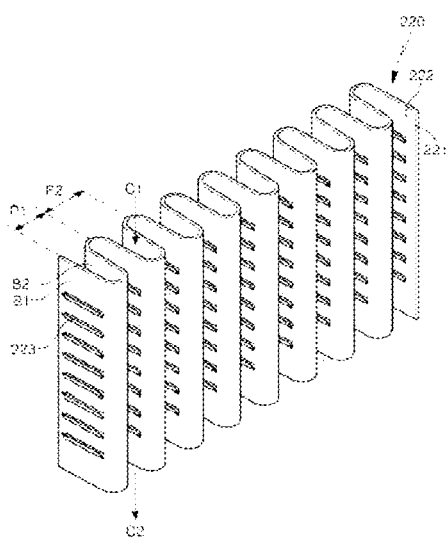
FIG. 11 is a diagram particularly illustrating a structure of a first heat conversion member of FIG. 10 according to an embodiment of the present invention.
Figure 12:
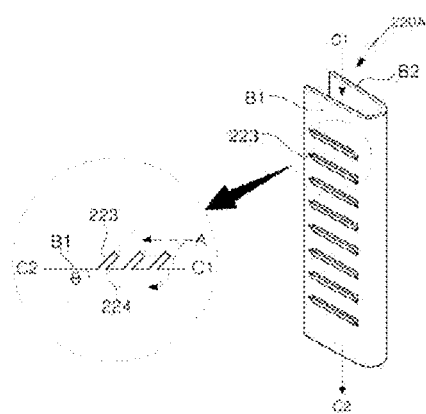
FIG. 12 is an enlarged conceptual diagram of a structure in which one channel pattern is formed in the first heat conversion member.

FIG. 11 is a diagram particularly illustrating a structure of the first heat conversion member 220 of FIG. 10 according to an embodiment of the present invention. FIG. 12 is an enlarged conceptual diagram of a structure in which one channel pattern 220A is formed in the first heat conversion member 220. Similarly, such a channel pattern may apply to the second heat conversion member 320 on the second substrate 150. The structure of the first heat conversion member 220 will be mainly described in detail below.

As illustrated in FIG. 11, the first heat conversion member 220 may include at least one channel pattern 220A in which an air channel C1 which is an air moving path is formed at a flat panel type base substrate including a first plane 221 and a second plane 222 opposite to the first plane 221 to perform surface contact with air.

The channel pattern 220A may be obtained by forming the base substrate in the form of a folding structure, i.e., the form of a folded structure, to form a curvature pattern having certain pitches P1 and P2 and a height T1 as illustrated in FIG. 11. That is, the heat conversion members 220 and 320 according to an embodiment of the present invention may have two planes to be in surface contact with air, and include a channel pattern for maximizing a contact surface area.

In the structure of FIG. 11, when air flows into an inlet in a direction of the channel C1, the air moves toward an end C2 of the channel C1 while being in smooth contact with the first plane 221 and the second plane 222 opposite to the first plane 221. Thus, the contact with a larger amount of air in the same space than that at a simple flat panel type contact surface may be induced, thereby greatly increasing the effect of absorbing or generating heat.

In particular, in order to more increase an area to be in contact with air, the heat conversion member 220 according to an embodiment of the present invention may include a resistance pattern 223 on a surface of the base substrate as illustrated in FIGS. 11 and 12. The resistance pattern 223 may be formed at each of a first curved surface B1 and a second curved surface B2 when a unit channel pattern is taken into account. The resistance pattern 223 may protrude toward one of the first plane 221 and the second plane 222 opposite to the first plane 221. Furthermore, the first heat conversion member 220 may further include a plurality of fluid flow grooves 224 passing through the surface of the base substrate, through which the contact with or movement of air between the first plane 221 and the second plane 222 of the heat conversion member 240 may be facilitated.

In particular, as illustrated in the partially enlarged view of FIG. 12, the resistance pattern 223 may be provided in the form of a protruding structure inclined at an angle of inclination θ in a direction of incoming air to maximize a degree of friction with the air, thereby more increasing an area of contact or contact efficiency. The angle of inclination θ is more preferably an acute angle between a line extending horizontally from a surface of the resistance pattern 223 and a line extending from a surface of the base substrate. This is because the effect of resistance decreases when the angle of inclination θ is a right angle or an obtuse angle. Furthermore, the plurality of fluid flow grooves 224 are arranged at a part connecting the resistance pattern 223 and the base substrate to increase resistance of a fluid such as air and efficiently move the fluid such as air to a surface opposite to the part connecting the resistance pattern 223 and the base substrate. In detail, the plurality of fluid flow grooves 224 may be formed on a surface of the base substrate in front of the resistance pattern 223 to cause a portion of air which is in contact with the resistance pattern 223 to pass through a front surface and a rear surface of the base substrate, thereby more increasing the frequency or area of contact with the air.

Although FIG. 12 illustrates that a channel pattern is formed to have certain pitches and a predetermined cycle, a unit pattern may have non-uniform pitches, a pattern cycle may be non-uniform, and furthermore, heights T1 of unit patterns may be non-uniform.

Although a structure in which one first heat conversion member is included in a heat conversion module of a heat transfer device according to an embodiment of the present invention has been described above with reference to FIGS. 10 to 12, a plurality of heat conversion members may be stacked in one heat transfer module in another embodiment. Thus, a surface area to be in contact with air or the like may be further maximized. Due to a particular feature of a heat conversion member having a folding structure according to the present invention, a larger number of contact surfaces may be achieved in a small area. Accordingly, more heat conversion members may be arranged in the same volume. In this case, a support substrate such as a second intermediate member may be further arranged between the plurality of stacked heat conversion members. Furthermore, according to another embodiment of the present invention, two or more thermoelectric modules may be provided.

Alternatively, pitches of a first heat conversion member of a thermoelectric module (a first substrate) forming a heat generation part and a second heat conversion member of a thermoelectric module (a second substrate) forming a heat absorbing part may be set to be different. In this case, particularly, a pitch of a channel pattern of a heat conversion member included in a heat conversion module forming a heat generation part may be formed to be equal to or greater than that of a channel pattern of a heat conversion member included in a heat conversion module forming a heat absorbing part. In this case, a ratio between a pitch of a channel pattern of a first heat conversion member of a first heat conversion part and a pitch of a channel pattern of a first heat conversion member of a second heat conversion part may be in a range of 0.5:1 to 2.0:1.

A larger contact area may be achieved within the same volume through a heat conversion member forming a channel pattern according to an embodiment of the present invention than a flat panel type heat conversion member or a conventional cooling fin structure. Accordingly, an area of contact with air may be increased by 50% or more than when the flat panel type heat conversion member is used, and thus module size may be greatly decreased. Furthermore, various materials, e.g., a metal material having high heat transfer efficiency, such as aluminum, synthetic resin, or the like may be used to form such a heat conversion member.

A modified example in which heat generation efficiency may be increased by changing a shape of a thermoelectric semiconductor device included in the thermoelectric module 100 applicable to the vehicle lamps of FIGS. 1 to 4 according to embodiments will be described below.

Figure 13:
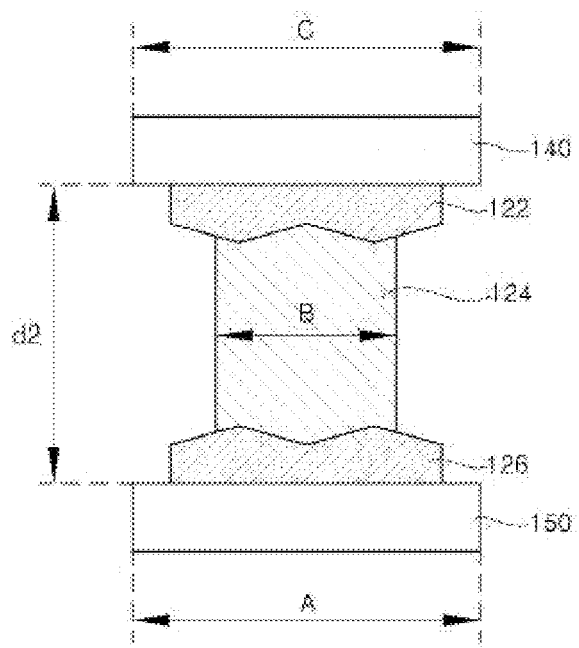
FIG. 13 is a cross-sectional view of essential parts of a thermoelectric module according to another embodiment of the present invention.

That is, a modified shape of a thermoelectric semiconductor device of FIG. 13 may be applied to a unit structure of a thermoelectric module as illustrated in FIG. 8. Referring to FIGS. 8 and 13, a thermoelectric element 120 according to a modified example of the present invention may include a first element 122 having a first cross-sectional area, a second element 126 having a second cross-sectional area at a location facing the first element 122, and a connection part 124 having a third cross-sectional area and connecting the first element 122 and the second element 126. Particularly, in this case, a cross-sectional area of a horizontal region of the connection part 124 may be smaller than the first cross-sectional area and the second cross-sectional area.

In this structure, when a material which is the same in terms of type and amount as a thermoelectric element having uniform cross-sectional areas, such as a regular hexahedral structure, is used, the areas of the first element 122 and the second element 126 and the length of the connection part 124 may be increased, thereby increasing a temperature difference OT between the first element 122 and the second element 126. When the temperature difference OT is increased, an amount of free electrons moving between a hot side and a cold side increases, thereby increasing an amount of electric current generated. Thus, heat generating efficiency or cooling efficiency may be increased.

Accordingly, in the thermoelectric element 120 according to the present embodiment, horizontal cross-sectional areas of the first element 122 and the second element 126 provided, in a flat panel form or a three-dimensional (3D) form, on and below the connection part 124 may be increased and the length of the connection part 124 may be increased to decrease a cross-sectional area of the connection part 124. In particular, in an embodiment of the present invention, a ratio between a width B of a longest cross section among horizontal cross sections of the connection part 124 and a width A or C of a larger cross-sectional area among horizontal cross-sectional areas of the first element 122 and the second element 126 may be in a range of 1:1.5 to 1:4. When the ratio between the width B and the width A or C is not in the range of 1:1.5 to 1:4, heat may be conducted from the hot side to the cold side and thus the thermoelectric efficiency may decrease or the efficiency of heat generation or cooling efficiency may decrease.

In another aspect of an embodiment of such a structure, a thickness a1 of the first element 122 and a thickness a3 of the second element 126 of the thermoelectric element 120 in a lengthwise direction may be less than a thickness s2 of the connection part 124 in a lengthwise direction.

Furthermore, in the present embodiment, the first cross-sectional area of the first element 122 and the second cross-sectional area of the second element 126, which are cross-sectional areas in a horizontal direction, may be set to be different, so that the thermoelectric efficiency can be adjusted to easily achieve a desired temperature difference. Furthermore, the first element 122, the second element 126, and the connection part 124 may be integrally formed. In this case, the first element 122, the second element 126, and the connection part 124 may be formed of the same material.

FIG. 14 illustrates an example of a thermoelectric semiconductor device manufactured in a different structure and by a different method from the thermoelectric semiconductor devices of FIGS. 8 and 13, according to another embodiment of the present invention.

Referring to FIG. 14, according to another embodiment of the present invention, a semiconductor device as described above may be manufactured in a stack type structure rather than a bulk type structure to achieve a thin-film type semiconductor device and improve cooling efficiency. In detail, the first semiconductor device 120 or the second semiconductor device 130 of FIG. 8 or 13 may be manufactured by forming a unit member including a plurality of structures coated with a semiconductor material and stacked on a sheet type base substrate, and cutting the unit member to prevent loss of materials thereof and improve electrical conductivity.

This method will be described with reference to FIG. 14 below. FIG. 14 illustrates a conceptual diagram of a process of manufacturing the above-described stack type unit member. Referring to FIG. 14, a unit member 110 is formed by preparing materials including a semiconductor material in the form of a paste, and applying the paste onto a base substrate 111, such as a sheet or a film, to form a semiconductor layer 112. As illustrated in FIG. 14, a unit thermoelectric element 120 is formed by forming a stacked structure by stacking a plurality of unit members 110a, 110b, 110c and 110d such as the unit member 110 and cutting the stacked structure. That is, the unit thermoelectric element 120 according to the present invention may be a stacked structure with a plurality of unit members 110 each including the semiconductor layer 112 stacked on the base substrate 111.

In the above process, the process of applying the semiconductor paste onto the base substrate 111 may be implemented by various methods. For example, the application process may be performed by preparing slurry by mixing tape casting, i.e., very fine semiconductor material power, with an aqueous or non-aqueous solvent and one selected from among a binder, a plasticizer, a dispersant, a defoamer, and a surfactant, and by molding the slurry into a desired shape having a certain thickness on a moving blade or a moving transfer base substrate. In this case, the base substrate 111 may be formed of a material such as a film or a sheet having a thickness range of 10 μm to 100 μm, and a P type material and an N type material for manufacturing the above-described bulk type element may be directly applied as the semiconductor material to be applied.

In a process of stacking the unit members 110 by aligning them in multiple layers, a stacked structure may be formed by pressing the unit members 110 at 50° C. to 250° C. In an embodiment of the present invention, the number of times of stacking the unit members 110 may be in a range of 2 to 50. Thereafter, the stacked structure may be cut to a desired shape and size, and a sintering process may be additionally performed.

A thickness, shape, and size of a unit thermoelectric element formed by stacking a plurality of unit members 110 manufactured according to the above-described process may be uniformly secured. That is, a conventional bulk type thermoelectric element is ingot-grinded and fine ball-milled, and then a sintered bulk structure is cut. Thus, a large amount of materials thereof are likely to be lost during the cutting of the sintered bulk structure, and the sintered bulk structure is difficult to cut to a uniform size. Since the bulk structure has a thickness of about 3 mm to 5 mm and is thus too thick to manufacture in a thin film form. In contrast, a stacked type unit thermoelectric element according to an embodiment of the present invention is manufactured by stacking a plurality of sheet type unit members in multiple layers and then cutting the plurality of stacked sheet type unit members. Thus, since materials thereof are hardly lost and have a uniform thickness, the uniformity of the materials may be secured, and the whole unit thermoelectric element has a thickness of 1.5 mm or less and may be thus formed in a thin film type. Accordingly, the unit thermoelectric element may be applied in various shapes.

Finally, a thermoelectric element according to an embodiment of the present invention as described above with reference to FIG. 8 or 13 may be obtained by cutting the unit thermoelectric element 120 as illustrated in FIG. 14(d). In particular, the process of manufacturing a unit thermoelectric element according to an embodiment of the present invention may further include forming a conductive layer on a surface of each of the unit members 110 during the forming of the stacked structure including the unit members 110.

Figure 15:
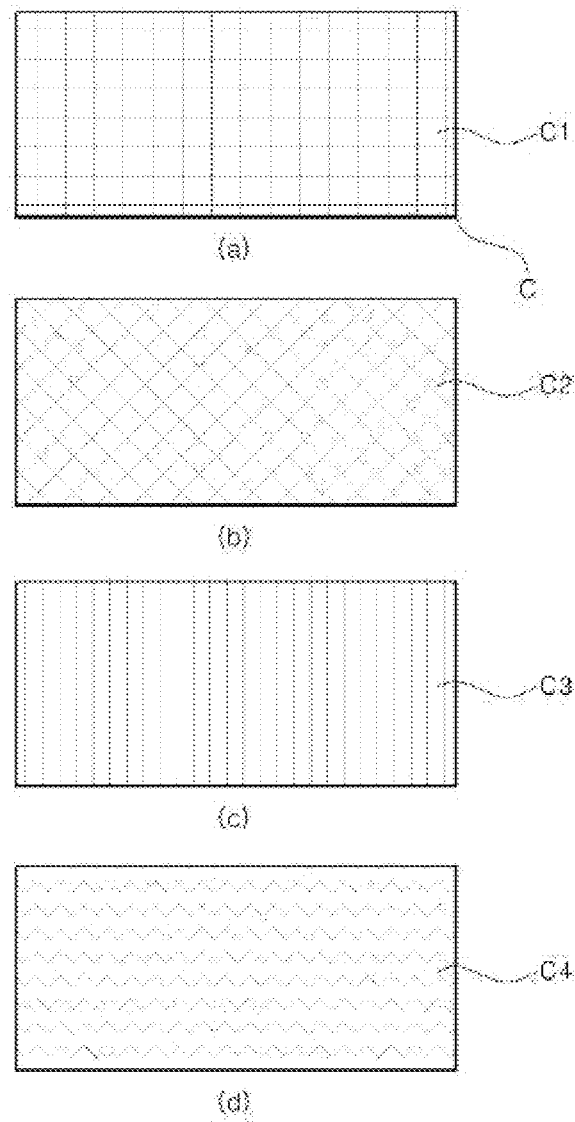
FIGS. 15 and 16 illustrate various modified examples of a conductive layer C according to an embodiment of the present invention.

That is, a conductive layer as illustrated in FIG. 15 may be formed between the unit members 110 of the stacked structure of FIG. 14(c). The conductive layer may be formed on a surface of the base substrate 111 opposite to a surface of the base substrate 111 on which a semiconductor layer is formed. In this case, the conductive layer may be configured as a layer patterned to form a region for exposing a surface of the unit member 110. Electrical conductivity may be higher, adhesion between the unit members 110 may be more improved, and thermal conductivity may be lower when the conductive layer is patterned than when each of the unit members 110 is entirely applied.

FIG. 15 illustrates various modified examples of a conductive layer C according to an embodiment of the present invention. A pattern of a conductive layer for exposing a surface of a unit member may be designed in various shapes, e.g., a mesh type structure including a closed-type opening pattern c1 or c2 as illustrated in FIG. 15(a) or (b) or a line type structure including an open-type opening pattern c3 or c4 as illustrated in FIG. 15(c) or (d). The conductive layer as described above may increase adhesion between unit members included in a unit thermoelectric element consisting of a stacked structure of the unit members, decrease thermal conductivity between the unit members, improve electrical conductivity, and improve cooling capacities Qc and ΔT (° C.), compared to those of a conventional bulk type thermoelectric element. In particular, a power factor increases 1.5 times, i.e., electrical conductivity increases 1.5 times. An increase in electrical conductivity is directly related to improvement in thermoelectric efficiency and thus cooling efficiency increases. The conductive layer may be formed of a metal material, and any metal electrode material such as Cu, Ag, or Ni is applicable to the conductive layer.

When the stacked type unit thermoelectric element described above with reference to FIG. 14 is applied to the thermoelectric module illustrated in FIGS. 8 and 9, i.e., when a thermoelectric element according to an embodiment of the present invention is arranged between the first substrate 140 and the second substrate 150 and a thermoelectric module is manufactured in the form of a unit cell including an electrode layer and a dielectric layer, the thermoelectric module may have a total thickness Th of 1.0 mm to 1.5 mm and may be thus much thinner than when a conventional bulk type element is used. In this case, when an apparatus for removing condensation from a vehicle lamp according to an embodiment of the present invention as described above with reference to FIGS. 1 to 4 is manufactured, the apparatus may be efficiently used in a limited space.

Figure 16:
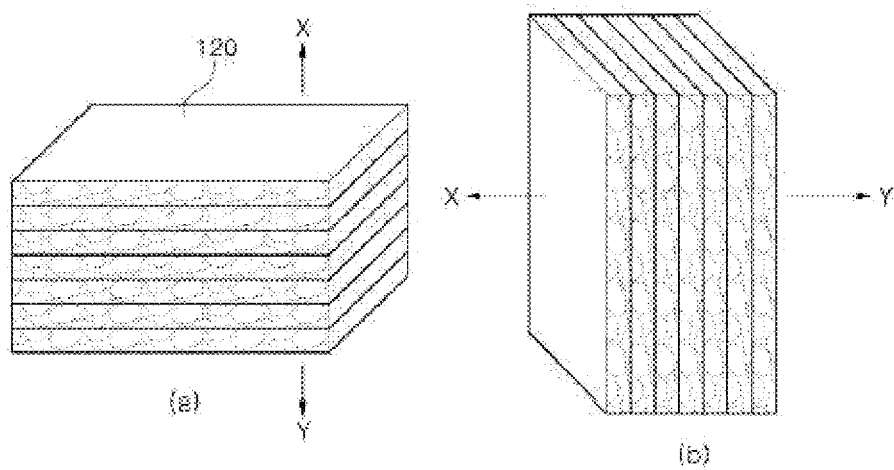
Figure 16:
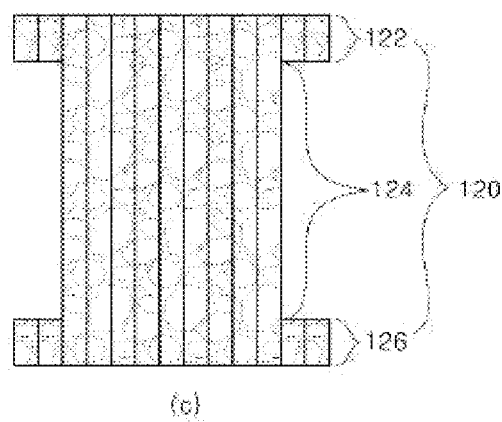

A thermoelectric element according to an embodiment of the present invention may be manufactured by aligning the thermoelectric elements 120 and 130 described above with reference to FIG. 11 such that they are located horizontally in an upward direction X and a downward direction Y as illustrated in FIG. 16(a), and cutting the thermoelectric elements 120 and 13 as illustrated in FIG. 16(c).

That is, a thermoelectric module may be formed such that first and second substrates, a semiconductor layer, and a surface of a base substrate are arranged to be adjacent to one another, but may be arranged to stand vertically such that side surfaces of a unit thermoelectric element are located adjacent to the first and second substrates as illustrated in FIG. 16(b). In this structure, end parts of a conductive layer are exposed via side surfaces of the thermoelectric module, thermal conduction efficiency in a vertical direction may decrease, and electrical conduction characteristics may increase, thereby more increasing cooling efficiency, compared to when the thermoelectric module is arranged horizontally. Furthermore, the shape of FIG. 11 may be cut as illustrated in FIG. 16(c) and be then applied.

As described above, in thermoelectric elements applicable to a thermoelectric module according to various embodiments of the present invention, a first semiconductor device and a second semiconductor device facing each other are the same in terms of shape and size, but in this case, electrical conductivity characteristics of a P type semiconductor device and electrical conductivity characteristics of an N type semiconductor device are different and cooling efficiency may be deteriorated. Thus, one of the first and second semiconductor devices may be formed to have a different volume from that of the other semiconductor device to improve cooling efficiency.

That is, to form semiconductor devices facing each other and having different volumes, semiconductor devices may be formed in different shapes, may be formed such that the semiconductor devices have the same height but a diameter of a cross section of one of the semiconductor devices is larger than that of a cross section of the other semiconductor device, or may be formed such that the semiconductor devices are the same in terms of shape but are different in terms of height or a diameter of a cross section thereof. In particular, thermoelectric efficiency may be improved by increasing a volume of an N type semiconductor device by forming the N type semiconductor device to have a greater diameter than that of a P type semiconductor device.

Thermoelectric elements having various structures and thermoelectric modules including the same according to embodiments of the present invention as described above are applicable to structures for achieving a warm current of air via an air channel part in the vehicle lamps illustrated in FIGS. 1 to 4 as described above.

While embodiments of the present invention have been described herein in detail, various modifications may be made therein without departing from the scope of the present invention. Therefore, the scope of the present invention should not be limited to these embodiments and should be defined by the appended claims and their equivalents.

REFERENCE NUMERALS

10: lens part
20: light source module
21: reflective part
30: bezel part
32: air channel part
40: thermoelectric circulation part
52: first heat conversion member
100: thermoelectric module
110: unit member
111: base substrate
112: semiconductor layer
120: thermoelectric element
122: first element
124: connection part
126: second element
130: thermoelectric element 132: first element
134: connection part
136: second element
140: first substrate
150: second substrate
160a, 160b: electrode layer
170a, 170b: dielectric layer
181, 182: circuit line
190: heating part
191: hot wire
200, 300: heat conversion part
210, 310: heat conversion part housing
220, 320: heat conversion member

The invention claimed is:

1. A vehicle lamp comprising:
a lens part;
a bezel part arranged to partially surround a certain distance from the lens part;
a light source module provided on the bezel part, the light source module including a reflective part accommodating a light-emitting device; and
a thermoelectric circulation part configured to provide air passing through a thermoelectric module into a separation space between the bezel part and the lens part,
wherein the thermoelectric module comprises a heating part configured to supply a heat source to a substrate forming a cooling region, the heating part located adjacent to the substrate.

2. The vehicle lamp of claim 1, wherein the thermoelectric module comprises a plurality of thermoelectric semiconductor devices arranged between a first substrate and a second substrate facing each other,
wherein a heat absorbing part which is a cooling region is provided on the second substrate.

3. The vehicle lamp of claim 2, wherein the heating part comprises a hot wire which is in contact with the second substrate.

4. The vehicle lamp of claim 2, wherein one end of the second substrate extends to be in contact with the reflective part of the light source module.

5. The vehicle lamp of claim 4, wherein one end of a second heat conversion member on the second substrate is in contact with the light source module.

6. The vehicle lamp of claim 4, further comprising a first heat conversion member arranged on the first substrate.

7. The vehicle lamp of claim 1, wherein the thermoelectric circulation part comprises a first ventilation module configured to supply air to a first heat conversion member arranged on a first substrate of the thermoelectric module.

8. The vehicle lamp of claim 7, further comprising a ventilation guide part having one end coupled to one end of the first heat conversion member, and another end communicating with the separation space.

9. The vehicle lamp of claim 8, further comprising an air channel part provided inside or on a surface of the bezel part, wherein one end of the air channel part communicates with the ventilation guide part, and another end of the air channel part communicates with the separation space.

10. The vehicle lamp of claim 9, wherein the air channel part comprises at least one air discharge part provided in a direction of the separation space.

11. The vehicle lamp of claim 10, wherein the air discharge part is provided on the same horizontal line as edge regions of the lens part.

12. The vehicle lamp of claim 10, wherein the air discharge part is provided in the form of wedge-shaped holes or the form of slits.

13. The vehicle lamp of claim 9, further comprising a second ventilation module arranged in the air channel part.

14. The vehicle lamp of claim 1, wherein a temperature of the air supplied into the separation space varies according to a temperature of a cooling part increased by the heating part.

15. A vehicle lamp comprising:
a lens part;
a bezel part arranged to partially surround a certain distance from the lens part;
a light source module provided on the bezel part, the light source module including a reflective part accommodating a light-emitting device; and
a thermoelectric circulation part configured to provide air passing through a thermoelectric module into a separation space between the bezel part and the lens part,
wherein one end of a substrate forming a cooling region extends to be in contact with the reflective part of the light source module.

16. The vehicle lamp of claim 15, wherein the thermoelectric module comprises a plurality of thermoelectric semiconductor devices arranged between a first substrate and a second substrate facing each other,
wherein a heat absorbing part which is a cooling region is provided on the second substrate.

17. The vehicle lamp of claim 15, wherein the thermoelectric circulation part comprises a first ventilation module configured to supply air to a first heat conversion member arranged on a first substrate of the thermoelectric module.

18. The vehicle lamp of claim 17, further comprising a ventilation guide part having one end coupled to one end of the first heat conversion member, and another end communicating with the separation space.

19. The vehicle lamp of claim 18, further comprising an air channel part provided inside or on a surface of the bezel part,
wherein one end of the air channel part communicates with the ventilation guide part, and another end of the air channel part communicates with the separation space.

20. The vehicle lamp of claim 19, wherein the air channel part comprises at least one air discharge part provided in a direction of the separation space.

* * * * *